United States Patent
Hu

(10) Patent No.: US 8,514,004 B2
(45) Date of Patent: Aug. 20, 2013

(54) CLOCK MANAGEMENT UNIT AND METHOD OF MANAGING A CLOCK SIGNAL

(75) Inventor: Weicong Hu, Jiangsu Province (CN)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 111 days.

(21) Appl. No.: 13/228,814

(22) Filed: Sep. 9, 2011

(65) Prior Publication Data

US 2012/0062282 A1 Mar. 15, 2012

(30) Foreign Application Priority Data

Sep. 10, 2010 (CN) .......................... 2010 1 0281126
Aug. 12, 2011 (KR) ........................ 10-2011-0080642

(51) Int. Cl.
*G06F 1/04* (2006.01)
*H03K 3/00* (2006.01)

(52) U.S. Cl.
USPC ........... 327/291; 327/142; 327/143; 327/298; 327/299

(58) Field of Classification Search
USPC .......................... 327/142, 143, 291, 298, 299
See application file for complete search history.

(56) References Cited

U.S. PATENT DOCUMENTS 5,623,223 A * 4/1997 Pasqualini .................... 327/298

FOREIGN PATENT DOCUMENTS

| JP | 2007-199991 | 8/2007 |
|---|---|---|
| JP | 2008-118179 | 5/2008 |
| JP | 2009-080634 | 4/2009 |

* cited by examiner

*Primary Examiner* — John Poos
(74) *Attorney, Agent, or Firm* — Volentine & Whitt, PLLC

(57) ABSTRACT

A clock management unit includes a delay unit; and an output unit, wherein the delay unit receives a clock signal and a reset signal for resetting an external circuit, and supplies a delayed reset signal to the output unit, wherein the output unit supplies to the external circuit an external clock signal obtained by processing the clock signal and the delayed reset signal, and wherein the external clock signal does not experience any edge transitions during at least two periods of the clock signal after the reset signal transitions to an active state for resetting the external circuit.

16 Claims, 3 Drawing Sheets

CLOCK MANAGEMENT UNIT AND METHOD OF MANAGING A CLOCK SIGNAL

CROSS-REFERENCE TO RELATED APPLICATIONS

This application claims the benefit of Chinese Patent Application No. 201010281126.2, filed on Sep. 10, 2010, in the State Intellectual Property Office, and the benefit of Korean Patent Application No. 10-2011-0080642, filed on Aug. 12, 2011, in the Korean Intellectual Property Office, the disclosures of which are incorporated herein by reference in their entireties.

BACKGROUND

In order to meet the requirements for digital chips having more functions and higher performance, a processor core, a plurality of multimedia modules, and various peripheral equipment modules are integrated in a single-chip application processor. Therefore, a plurality of circuit modules are usually integrated in a processor, and the number of gates included in the processor increases to several tens of millions or more. Since the circuit modules in a chip use different clock sources, there are many asynchronous reset circuit modules that are required to be tested to ascertain whether a timing violation occurs during a post-design operation (e.g., during a timing closure).

In more detail, when a chip is tested, a plurality of circuit modules in the chip may be reset in response to one or more reset signals. The reset signals may be at a high level or low level. When high level (or low level) reset signals are received, the circuit modules may be reset. If a rising edge (or a falling edge) of a clock signal input with respect to a circuit module occurs at or near a point in time when the circuit module receives a reset signal, the reset signal may not be accurately captured by the circuit module. If the reset signal is not accurately captured by the circuit module, a timing violation may occur, which may cause instability within the circuit module and may cause a failure in the test of the circuit module. Therefore, in the related art, a method of synchronizing a reset signal with a clock signal so as to maintain an interval between a time when the reset signal releases and a time when a rising edge (or a falling edge) of the clock signal occurs is proposed.

FIG. 1 is a diagram illustrating a circuit used for synchronizing a reset signal and a clock signal according to the related art, and FIG. 2 is a timing diagram of the circuit of FIG. 1.

Referring to FIGS. 1 and 2, a reset synchronizer 10 includes a first D flip-flop 11 and a second D flip-flop 12. A clock signal CLK drives first D flip-flop 11 (for example, via one or more buffers) and second D flip-flop 12. A pull up signal PULL-UP or a pull down signal (not shown) is supplied to first D flip-flop 11. An external circuit 20 may include flip-flops, logic devices, memory device, and/or other types of circuits. The clock signal CLK also drives the external circuit 20 (again, for example, via one or more buffers).

As shown in FIG. 1, a reset signal RESET for resetting the external circuit 20 is not directly supplied to the external circuit 20 but instead is supplied to reset synchronizer 10. The reset signal RESET is converted into an inverted reset signal RESET_n and the inverted reset signal RESET_n is supplied to the first D flip-flop 11 and the second D flip-flop 12. Reset synchronizer 10 outputs a synchronized reset signal RESET_n', which is synchronized with the clock signal CLK, according the inverted reset signal RESET_n and the clock signal CLK. As illustrated in FIG. 2, a sufficient interval is maintained between a release time of the synchronized reset signal RESET_n' and a rising edge of the clock signal CLK, so that a timing violation may be prevented. A violation window is also illustrated in FIG. 2. If a release time of a reset signal supplied to external circuit 20 is within the violation window, a timing violation may occur in external circuit 20.

However, in the circuit as illustrated in FIG. 1, the clock signal CLK is supplied while the reset signal RESET_n' is supplied to external circuit 20. Therefore, during a post-design operation, for example, during a timing closure, a specialized Post-Static Timing Analysis (Post-STA) is required for each module including the conventional circuit shown in FIG. 1, so as to determine whether a sufficient interval is maintained between the release time of the synchronized reset signal RESET_n' and the rising edge of the clock signal CLK.

SUMMARY

The inventive concept provides a clock management unit capable of maintaining an interval for a predetermined time period, wherein the interval is between a time when a reset signal releases and a time when a clock signal is provided to an external circuit.

According to an aspect of the inventive concept, there is provided a clock management unit including a first flip-flop; a second flip-flop; and a clock gate. The first flip-flop includes a first D terminal configured to receive a reset signal that is provided to an external circuit for resetting the external circuit, a first clock terminal configured to receive a clock signal, and a first output terminal. The second flip-flop includes a second D terminal connected to the first output terminal of the first flip-flop, a second clock terminal configured to receive the clock signal, and a second output terminal. The clock gate includes an enable terminal connected to the second output terminal of the second flip-flop, a third clock terminal for receiving the clock signal, and an external clock terminal connected to the external circuit. The clock gate is configured to provide an external clock signal to the external circuit through the external clock terminal according to the output of the second output terminal of the second flip-flop.

The clock management unit may further include at least one flip-flop that is cascaded in series between the first flip-flop and the second flip-flop.

The clock management unit may further include an AND gate, the AND gate may receive the reset signal and an enable signal and may provide the reset signal to the first D terminal of the first flip-flop according to the enable signal, and the enable signal may be provided to the external circuit so as to operate the external circuit.

The external clock signal may not exhibit any edge transitions for at least two periods of the clock signal after the reset signal is activated to reset the external circuit.

The reset signal and the enable signal may be activated when they have a high level, and when the AND gate receives the reset signal having high level and the enable signal having the high level, the AND gate may provide the reset signal having the high level to the first D terminal of the first flip-flop.

Each of the first flip-flop and the second flip-flop may be a rising edge-triggered D flip-flop.

According to another aspect of the inventive concept, there is provided a clock management unit including a delay unit; and an output unit, wherein the delay unit is configured to receive a clock signal, and is further configured to receive a reset signal for resetting an external circuit, and is still further configured to supply a delayed reset signal to the output unit, wherein the output unit is configured to supply to the external circuit an external clock signal obtained by processing the clock signal and the delayed reset signal, and wherein the external clock signal does not exhibit any edge transitions for at least two periods of the clock signal after the reset signal transitions to an active state for resetting the external circuit.

The delay unit may include a first flip-flop and a second flip-flop that are cascaded in series with each other.

The delay unit may further include at least one flip-flop that is cascaded in series between the first flip-flop and the second flip-flop.

Each of the first flip-flop and the second flip-flop may be a rising edge-triggered D flip-flop.

The clock management unit may further include an input unit for receiving the reset signal and an enable signal and for providing the reset signal to the delay unit according to the enable signal.

When the input unit receives the reset signal having a high level and the enable signal having a high level, the input unit may provide the reset signal having a high level to the delay unit.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
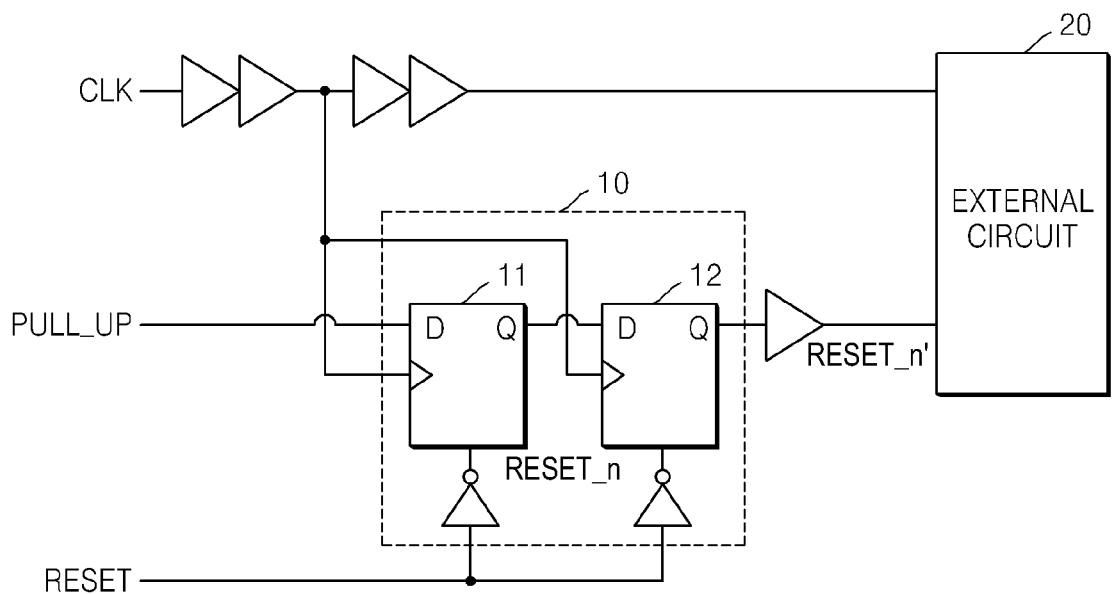
FIG. 1 is a diagram illustrating a circuit used for synchronizing a reset signal and a clock signal according to the related art.
Figure 2:
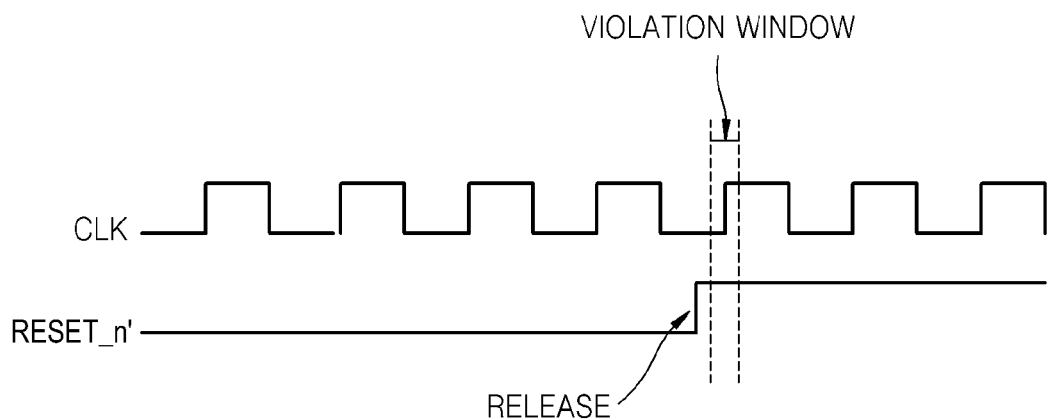
FIG. 2 is a timing diagram of the circuit of FIG. 1.

The inventive concept will now be described more fully with reference to the accompanying drawings, in which exemplary embodiments of the inventive concept are shown. The inventive concept may, however, be embodied in many different forms, and should not be construed as being limited to the embodiments set forth herein; rather, these embodiments are provided so that this disclosure will be thorough and complete, and will fully convey the inventive concept to those skilled in the art. In the drawings, the relative sizes or areas of layers and regions are exaggerated for clarity. Like reference numerals denote like elements throughout the specification.

Figure 3:
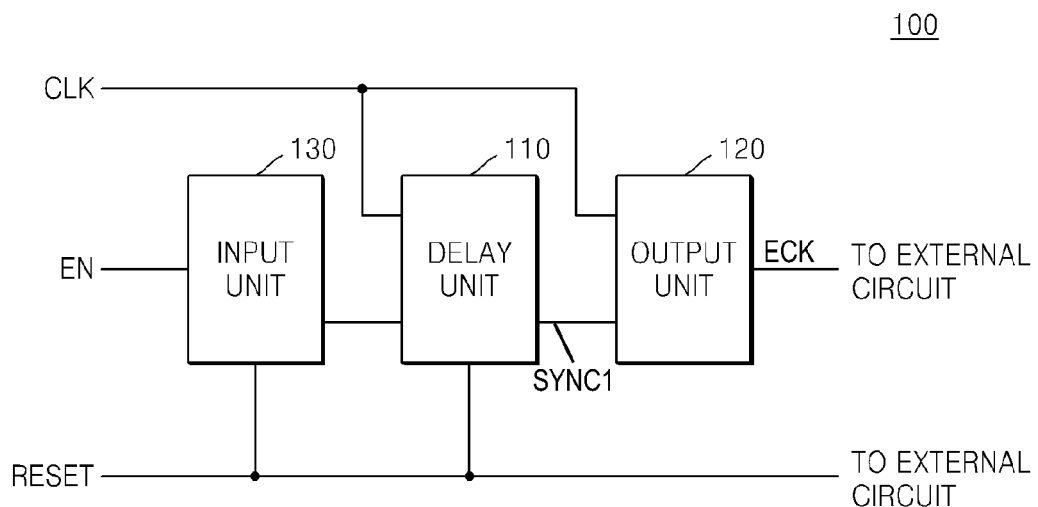
FIG. 3 is a block diagram illustrating one embodiment of a clock management unit.

FIG. 3 is a block diagram illustrating one embodiment of a clock management unit.

Referring to the present embodiment, the clock management unit 100 may receive a clock signal CLK that is used to drive an external circuit (not shown in FIG. 3, but see FIG. 1) such as various circuit modules in a chip. A reset signal RESET may reset the external circuit and may be simultaneously supplied to clock management unit 100 and the external circuit. Clock management unit 100 provides an external clock signal ECK to the external circuit after an interval of at least two periods of the clock signal CLK, from the time when the reset signal RESET is supplied to the external circuit in order to reset the external circuit (i.e., the time when the reset signal RESET releases). That is, an interval between the release time of the reset signal RESET and the time when the external clock signal ECK is provided to the external circuit (for example, the time when a rising edge of the external clock signal ECK reaches the external circuit) may be at least two periods of the clock signal CLK, so as to prevent a timing violation from occurring when the release time of the reset signal RESET occurs close to the clock signal CLK (e.g., a rising edge of the clock signal CLK).

To do so, clock management unit 100 may include a delay unit 110 and an output unit 120, as illustrated in FIG. 3. Delay unit 110 may receive the clock signal CLK and the reset signal RESET. Delay unit 110 may delay the reset signal RESET and output a delayed reset signal SYNC1. Output unit 120 may receive the clock signal CLK and the delayed reset signal SYNC1. Output unit 120 may provide external clock signal ECK to the external circuit according to the delayed reset signal SYNC1. Thus, no clock signal is provided to the external circuit in the period up to at least two periods of the clock signal CLK after the external circuit receives the reset signal SYNC1. Therefore, the timing violation may be prevented.

In order to reduce power consumption, in general, the external circuit may be enabled to perform an operation by an enable signal EN that is input from outside. In that case, the enable signal EN may be provided to clock management unit 100 at the same time. Accordingly, clock management unit 100 may include an input unit 130. Input unit 130 may receive the reset signal RESET and the enable signal EN, and may provide the reset signal RESET to the delay unit 110 according to the received enable signal EN. Accordingly, when the external circuit is disabled since no enable signal EN is received, clock management unit 100 does not operate since no enable signal EN is received, and therefore, power consumption may be reduced.

Figure 4:
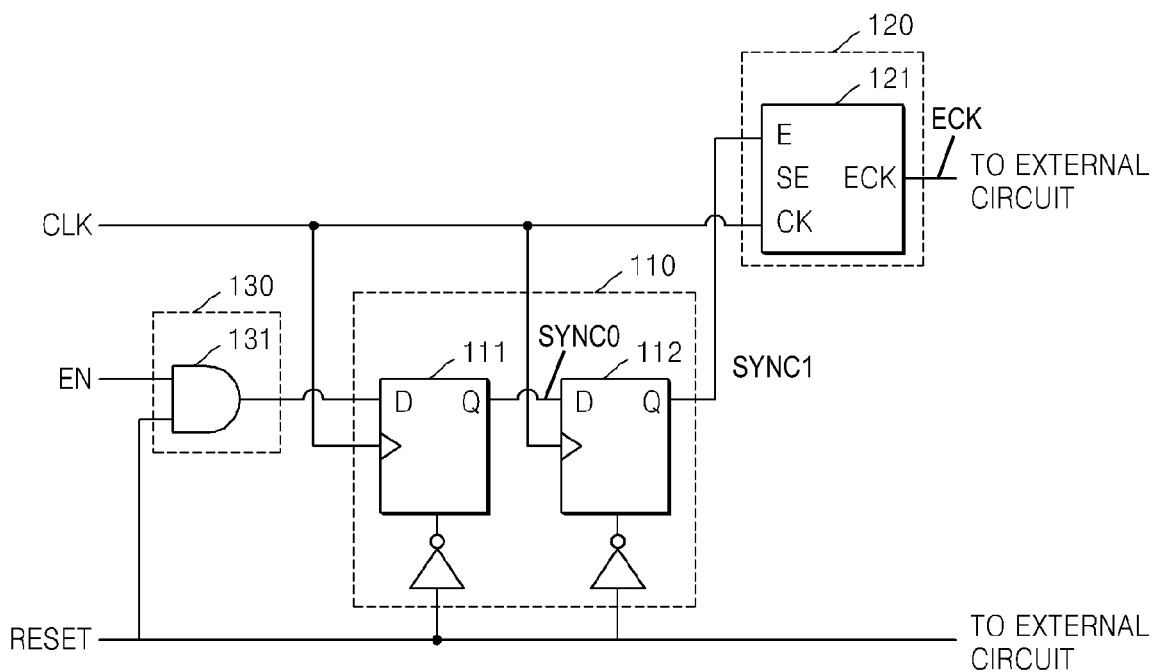
FIG. 4 is a schematic diagram illustrating one embodiment of a circuit for implementing the clock management unit of FIG. 3.
Figure 5:
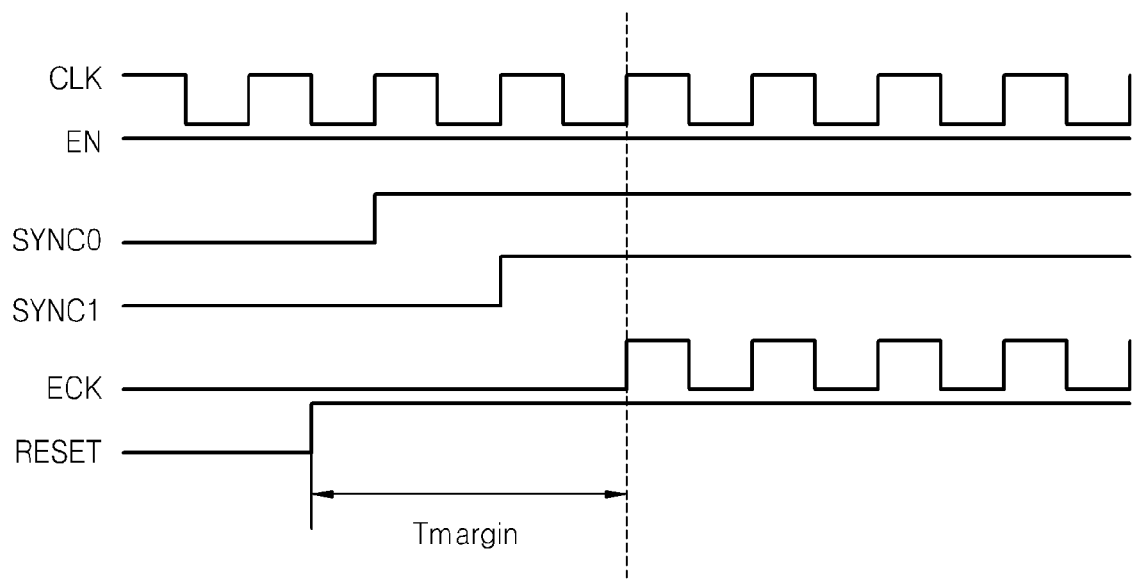
FIG. 5 is a timing diagram of the embodiment of a clock management unit of FIG. 4.

FIG. 4 is a schematic diagram illustrating one embodiment of a circuit for implementing clock management unit 100. FIG. 5 is a timing diagram of the embodiment of the clock management unit of FIG. 4. FIG. 4 schematically illustrates a circuit configuration of the clock management unit 100. However in other embodiments, other circuit configurations may be used in order to implement the clock management unit 100.

As shown in the circuit of FIG. 4, delay unit 110 may include flip-flops such as D flip-flops. In order to delay the reset signal RESET with respect to a desired time, the delay unit 110 may include at least two flip-flops. For convenience of description, delay unit 110 shown in FIG. 4 includes two flip-flops, namely, first and second flip-flops 111 and 112. In the present embodiment, first and second flip-flops 111 and 112 may be rising edge-triggered D flip-flops.

First flip-flop 111 may include a first D terminal that receives the reset signal RESET (for example, gated by an AND gate 131 of input unit 130), a first clock terminal that receives the clock signal CLK, and a first output terminal that is connected to a second D terminal of second flip-flop 112. Alternatively, the reset signal RESET may be supplied to a first reset terminal of first flip-flop 111.

Second flip-flop 112 may include the second D terminal that is connected to the first output terminal of first flip-flop 111, a second clock terminal that receives the clock signal CLK, and a second output terminal that is connected to output unit 120. Alternatively, the reset signal RESET may be supplied to a second reset terminal of second flip-flop 112.

As shown in FIG. 4, output unit 120 may include a clock gate 121. Clock gate 121 may include an enable terminal E that is connected to the second output terminal of the flip-flop 112, a clock terminal that receives the clock signal CLK, a scan enable terminal that receives a scan enable signal SE, and an external clock terminal ECK that is connected to the external circuit. Clock gate 121 may provide clock signals to the external circuit through the external clock terminal ECK according to the output from the second output terminal of second flip-flop 112.

The truth table of clock gate 121 is shown in Table 1.

TABLE 1

| CK | SE | E | ECK[n + 1] |
|---|---|---|---|
| 1 | X | X | ECK[n] |
| 0 | 0 | 0 | 0 |
| 0 | 0 | 1 | 0 |
| 0 | 1 | 0 | 0 |
| 0 | 1 | 1 | 0 |

AND gate 131 may receive the reset signal RESET and the enable signal EN, and may provide the reset signal RESET to the first D terminal of the first flip-flop 111 according to the state of the enable signal EN. In this example, the reset signal RESET and the enable signal EN may be at a high level when activated. When AND gate 131 receives the high level reset signal RESET and the high level enable signal EN, AND gate 131 provides the high level reset signal RESET to the first D terminal of first flip-flop 111. Meanwhile, when the external circuit does not operate because no high level enable signal EN is received, AND gate 131 does not provide the reset signal RESET to delay unit 110, so that power consumption is reduced.

In FIG. 5, a reference signal SYNC0 indicates the output signal of the first flip-flop 111, delayed reset signal SYNC1 indicates the output signal of the second flip-flop 112, and delayed clock signal ECK indicates the output signal of clock gate 121. As shown in FIG. 5, first flip-flop 111 may output the high level signal SYNC0 at a rising edge of the clock signal CLK, so as to delay the signal SYNC0 for a certain time with respect to the reset signal RESET. For example, first flip-flop 111 may delay the signal SYNC0 for half a period of the clock signal CLK with respect to the reset signal RESET. However, the delayed time depends on a state of the clock signal CLK that is received by first flip-flop 111 at a rising edge of the reset signal RESET. Second flip-flop 112 may output the high level signal SYNC1 at a rising edge of the clock signal CLK, so as to delay the delayed enable signal SYNC1 for one period of the clock signal CLK with respect to the signal SYNC0. Then, clock gate 121 begins to output the signal ECK at a next rising edge of the clock signal CLK, which is caused by a characteristic (e.g., the truth table) of clock gate 121 as described above. Therefore, the time interval Tmargin between the time when the reset signal RESET releases and the time when the external clock signal ECK is applied to the external circuit (for example, the rising edge of the signal ECK output from the effective clock terminal of clock gate 121) may be equal to or larger than two periods of the clock signal CLK. Therefore, the release of the reset signal RESET reaches a stable state before the rising edge of the external clock signal ECK provided to the external circuit occurs, so that the timing violation may be prevented.

In the embodiment illustrated in FIG. 4, two flip-flops are adopted to constitute delay unit 110 to perform synchronizing so that metastability may be prevented. In particular, the reset signal RESET is asynchronous with first flip-flop 111, i.e., the arriving time of the reset signal RESET is uncertain, thus, if the arriving time of the reset signal RESET does not satisfy the timing requirement of first flip-flop 111, the first flip-flop 111 may be at a metastable state, and the output value thereof may be uncertain. Therefore, the uncertain value may be prevented from further transmission by cascading second flip-flop 112.

According to another embodiment, delay unit 110 may include N flip-flops (where, N is a natural number equal to or greater than 2), i.e., the first flip-flop to the $N^{th}$ flip-flop.

According to the embodiment illustrated in FIG. 4, the first flip-flop may include a first D terminal that receives a reset signal (for example, the reset signal provided from the AND gate), a first clock terminal that receives a clock signal, and a first output terminal that is connected to a second D terminal of a second flip-flop. Alternatively, the reset signal may be provided to a first reset terminal of the first flip-flop.

In an embodiment having N flip-flops, an $i^{th}$ flip-flop (where, i is a natural number greater than 1 and less than N) may include an $i^{th}$ D terminal that is connected to an $(i-1)^{th}$ output terminal of an $(i-1)^{th}$ flip-flop, an $i^{th}$ clock terminal that receives the clock signal, and an $i^{th}$ output terminal that is connected to an $(i+1)^{th}$ D terminal of an $(i+1)^{th}$ flip-flop. Alternatively, the reset signal may be provided to an $i^{th}$ reset terminal of the $i^{th}$ flip-flop.

The $N^{th}$ flip-flop may include an $N^{th}$ D terminal that is connected to an $(N-1)^{th}$ output terminal of an $(N-1)^{th}$ flip-flop, an $N^{th}$ clock terminal that receives the clock signal, and an $N^{th}$ output terminal that is connected to the enable terminal of the clock gate 121. Alternatively, the reset signal may be provided to an reset terminal of the $N^{th}$ flip-flop.

Therefore, the number of flip-flops included in delay unit 110 may be determined as needed, so as to maintain a predetermined interval between the time when the reset signal releases and the time when the clock signal is provided to the external circuit, e.g., for at least two periods of the clock signal.

According to the one or more embodiments of the inventive concept, the interval between the time when the reset signal releases and the time when the clock signal is provided from the effective clock terminal of the clock gate (for example, the time when the rising edge of the clock signal reaches the external circuit) is maintained to be at least two periods of the clock signal, so as to prevent the time violation occurring when the release time of the reset signal is close to the clock signal (e.g., a rising edge of the clock signal).

Accordingly, during at least two periods of the clock signal after the reset signal releases, no clock signal is provided to the external circuit. Therefore, during a post-design (e.g., during a timing closure), a test for determining whether a sufficient interval is maintained between a release time of a reset signal and a clock signal (for example, a rising edge of the clock signal) is not required, so that the post design including the timing closure and the like is simplified.

While the inventive concept has been particularly shown and described with reference to exemplary embodiments thereof, it will be understood that various changes in form and details may be made therein without departing from the spirit and scope of the following claims.

What is claimed is:

1. A clock management unit comprising:
   a first flip-flop;
   a second flip-flop;
   a clock gate; and
   an AND gate,
   wherein the first flip-flop comprises a first D terminal configured to receive a reset signal provided to an external circuit for resetting the external circuit, a first clock terminal configured to receive a clock signal, and a first output terminal, the second flip-flop comprises a second D terminal connected to the first output terminal of the first flip-flop, a second clock terminal configured to receive the clock signal, and a second output terminal, the clock gate comprises an enable terminal connected to the second output terminal of the second flip-flop, a third clock terminal configured to receive the clock signal, and an external clock terminal connected to the external circuit, the clock gate being configured to provide an external clock signal to the external circuit through the external clock terminal according to an output signal of the second output terminal of the second flip-flop, the AND gate receives the reset signal and an enable signal and provides the reset signal to the first D terminal of the first flip-flop according to the enable signal, the enable signal is provided to the external circuit so as to operate the external circuit, and the external clock signal does not exhibit an edge transition for at least two periods of the clock signal after the reset signal is activated to reset the external circuit.

2. The clock management unit of claim 1, wherein the reset signal and the enable signal are activated when they have a high level, and when the AND gate receives the reset signal having the high level and the enable signal having the high level, the AND gate provides the reset signal having the high level to the first D terminal of the first flip-flop.

3. The clock management unit of claim 1, wherein each of the first flip-flop and the second flip-flop is a rising edge-triggered D flip-flop.

4. A clock management unit comprising:
a delay unit including a first flip-flop, a second flip-flop, and at least one flip-flop between the first flip-flop and the second flip-flop, wherein the first flip-flop, the second flip-flop, and the at least one flip-flop are cascaded in series one with another, the delay unit being configured to receive a clock signal, receive a reset signal for resetting an external circuit, and supply a delayed reset signal to an output unit,
wherein the output unit is configured to supply the external circuit an external clock signal obtained by processing the clock signal and the delayed reset signal, and
the external clock signal does not exhibit an edge transition during at least two periods of the clock signal after the reset signal transitions to an active state for resetting the external circuit.

5. The clock management unit of claim 4, wherein each of the first flip-flop and the second flip-flop is a rising edge-triggered D flip-flop.

6. The clock management unit of claim 4, further comprising:
an input unit configured to receive the reset signal and an enable signal, and to provide the reset signal to the delay unit according to the enable signal.

7. The clock management unit of claim 6, wherein the input unit is further configured to provide the reset signal having a high level to the delay unit when the input unit receives the reset signal having a high level and the enable signal having a high level.

8. A method managing a clock signal, comprising:
providing a reset signal from an AND gate in response to a received reset signal and a received enable signal, wherein the enable signal is provided to the external circuit;
receiving the reset signal in a first D terminal of a first flip-flop, and receiving a clock signal in a first clock terminal of the first flip-flop;
receiving the clock signal in a second clock terminal of a second flip-flop series connected with the first flip-flop and having a second D terminal connected to a first output terminal of the first flip-flop;
receiving the clock signal at a third clock terminal of a clock gate having an enable terminal connected to a second output terminal of the second flip-flop;
providing an external clock signal to an external circuit from an external clock terminal of the clock gate according to an output signal of the second output terminal of the second flip-flop, wherein the external clock signal does not exhibit an edge transition for at least two periods of the clock signal after the reset signal is activated to reset the external circuit.

9. The method of claim 8, wherein the external clock signal does not exhibit an edge transition while the enable signal is in an inactive state.

10. The method of claim 8, further comprising:
supplying the enable signal to the external circuit to enable operation of the external circuit.

11. The method of claim 8, wherein generating the external clock signal comprises:
delaying the reset signal; and
gating the clock signal with the delayed reset signal to generate the external clock signal.

12. The method of claim 11, wherein delaying the reset signal comprises passing the reset signal though a cascade of at least two flip-flops commonly clocked by the clock signal.

13. The method of claim 8, further comprising supplying the reset signal to the external circuit to reset operation of the external circuit.

14. A clock management unit comprising:
an AND gate that provides a reset signal used to reset operation of an external circuit in response to a enable signal;
a first flip-flop including a first D terminal that receives the reset signal, a first clock terminal that receives a clock signal, and a first output terminal;
a second flip-flop including a second D terminal connected to the first output terminal, a second clock terminal that receives the clock signal, and a second output terminal;
a clock gate including an enable terminal connected to the second output terminal, a third clock terminal that receives the clock signal, and an external clock terminal connected to the external circuit, wherein the clock gate provides an external clock signal to the external circuit via the external clock terminal in response to an output signal provided at the second output terminal,
wherein the first flip-flop, the second flip-flop, and at least one additional flip-flop connected between the first flip-flop and the second flip-flop are series connected in a cascade.

15. The clock management unit of claim 14, wherein the reset signal and the enable signal are activated at a high level when the AND gate receives the reset signal at the high level and receive the enable signal at the high level.

16. The clock management unit of claim 14, wherein each of the first flip-flop and the second flip-flop is a rising edge-triggered D flip-flop.

* * * * *